(12) United States Patent
Suh (10) Patent No.: US 11,765,855 B2
(45) Date of Patent: Sep. 19, 2023

(54) HEATING AND AIR PURIFYING APPARATUS USING ELECTRONIC DEVICE HEAT

(71) Applicant: paymentinApp Inc., Seoul (KR)

(72) Inventor: Jung Hyung Suh, Seoul (KR)

(73) Assignee: PAYMENTINAPP INC., Seoul (KR)

( * ) Notice: Subject to any disclaimer, the term of this patent is extended or adjusted under 35 U.S.C. 154(b) by 16 days.

(21) Appl. No.: 17/520,685

(22) Filed: Nov. 7, 2021

(65) Prior Publication Data
US 2022/0312635 A1    Sep. 29, 2022

(30) Foreign Application Priority Data

Mar. 29, 2021  (KR) .................. 10-2021-0040063
Nov. 1, 2021   (KR) .................. 10-2021-0147683

(51) Int. Cl.
H05K 7/20    (2006.01)
G06F 1/20    (2006.01)

(52) U.S. Cl.
CPC .......... *H05K 7/20163* (2013.01); *G06F 1/20* (2013.01); *H05K 7/20181* (2013.01)

(58) Field of Classification Search
CPC ... H05K 7/20163; H05K 7/20181; G06F 1/20
USPC ....................................................... 361/695
See application file for complete search history.

(56) References Cited

U.S. PATENT DOCUMENTS

| 4,699,208 | A | * | 10/1987 | Wolf | H05K 7/20918 165/47 |
| 4,874,040 | A | * | 10/1989 | Herrmann | F24F 1/0063 165/122 |
| 4,949,218 | A | * | 8/1990 | Blanchard | H05K 7/206 165/122 |
| 5,806,583 | A | * | 9/1998 | Suzuki | H01L 23/467 165/104.34 |
| 5,823,248 | A | * | 10/1998 | Kadota | F25B 23/006 165/104.33 |
| 6,131,647 | A | * | 10/2000 | Suzuki | F28D 15/0266 165/104.33 |
| 6,164,369 | A | * | 12/2000 | Stoller | H05K 7/20572 165/104.34 |
| 6,515,856 | B2 | * | 2/2003 | Hidesawa | G06F 1/206 361/679.48 |
| 6,575,230 | B1 | * | 6/2003 | Kadota | F28D 15/0266 165/104.34 |

(Continued)

FOREIGN PATENT DOCUMENTS

KR   10-1817333 B1   1/2018

*Primary Examiner* — Anatoly Vortman (57) ABSTRACT

A heating and air purifying apparatus using electronic device heat includes: a cabinet accommodating electronic devices including a central processing unit (CPU), a graphic processing unit (GPU), a power supply unit (PSU), and a main board, having an air inlet on a side, and having an air outlet on a top; one or more partition plates disposed vertically, horizontally, or diagonally across the inner surface of the cabinet; and a discharge fan installed at the air outlet and discharging air in the cabinet to the outside, in which a cooling fan of the GPU is disposed on a side of the one or more partition plate, a GPU body including a graphic card of the GPU is disposed on the opposite side, and the CPU, the PSU, and the main board are accommodated in a space facing a side of the one or more partition plate.

10 Claims, 8 Drawing Sheets

(56) References Cited

U.S. PATENT DOCUMENTS

| | | | |
|---|---|---|---|
| 6,975,509 B2* | 12/2005 | Osborn | G06F 1/20 165/80.2 |
| 7,154,748 B2* | 12/2006 | Yamada | H05K 7/20572 361/695 |
| 7,190,576 B2* | 3/2007 | Wang | G06F 1/20 361/679.48 |
| 7,701,712 B2* | 4/2010 | Kramer | H01L 23/473 361/678 |
| 7,813,121 B2* | 10/2010 | Bisson | H05K 7/20736 361/679.53 |
| 8,223,492 B2* | 7/2012 | Ji | H05K 7/20572 361/679.48 |
| 8,325,478 B2* | 12/2012 | Siracki | H05K 7/20145 361/679.48 |
| 8,503,178 B2* | 8/2013 | Chen | H05K 7/202 361/679.48 |
| 8,514,571 B2* | 8/2013 | Ji | H05K 7/20572 361/679.48 |
| 8,885,341 B2* | 11/2014 | Desmarets | H05K 7/20736 361/689 |
| 11,191,191 B2* | 11/2021 | Krippner | H05K 7/2039 |
| 2007/0195499 A1* | 8/2007 | Chu | G06F 1/20 361/695 |
| 2008/0055846 A1* | 3/2008 | Clidaras | H05K 7/1497 361/679.41 |
| 2008/0094799 A1* | 4/2008 | Zieman | F28F 9/0268 361/695 |
| 2008/0113604 A1* | 5/2008 | Tufford | G06F 1/20 454/187 |
| 2010/0253189 A1* | 10/2010 | Ji | H05K 7/20572 312/236 |
| 2012/0199003 A1* | 8/2012 | Melikov | G16H 50/80 454/192 |
| 2022/0312635 A1* | 9/2022 | Suh | H05K 7/20181 |

* cited by examiner

HEATING AND AIR PURIFYING APPARATUS USING ELECTRONIC DEVICE HEAT

CROSS REFERENCE TO RELATED APPLICATION

This present application claims priority under 35 U.S.C. § 119(a) to Korean Patent Application No. 10-2021-0040063 filed on Mar. 29, 2021 and Korean Patent Application No. 10-2021-0147683 filed on Nov. 1, 2021, in the Korean Intellectual Property Office, the entire contents of which are incorporated herein by reference.

BACKGROUND

(a) Technical Field

The present disclosure relates to a heating and air purifying apparatus using electronic device heat and, more particularly, to a heating and air purifying apparatus using electronic device heat, the apparatus cooling electronic devices generating high-temperature heat such as a Central Processing Unit (CPU) and a Graphics Processing Unit (GPU), and purifying air and producing hot air using heat generated by electronic devices.

(b) Background Art

In general, electronic devices such as a CPU and a GPU generate high-temperature heat while operating.

In general, since such electronic devices are installed in a closed cabinet, a water-cooling or air-cooling device is attached for normal operation, but in addition to the high temperature heat, noise is generated due to the cooling device in some cases.

A lot of energy is already consumed to operate electric devices, but more energy is consumed to operate separate cooling devices distributed for the electronic devices, respectively, to cool the electronic devices.

The heat generated by electronic devices and the energy for reducing the heat are consumed as volatility.

Recently, various methods of reducing heat that is generated by an electronic device and of cooling the electronic device using less energy have been studied, but the structural problem wasting energy by operating a separate cooling device has not been solved yet.

A cooling device having high cooling performance and generating less noise generally consumes much energy and is individually installed on a plurality of electronic devices such as a CPU and a GPU, so there is a problem that power consumption increases in geometric progression.

SUMMARY OF THE DISCLOSURE

In order to solve the problems of the related art described above, the present disclosure proposes a heating and air purifying apparatus using electronic device heat, the apparatus being able to quickly and effectively remove heat, which is generated from an electronic device accommodated in a cabinet, and being able to use the heat for heating and air purifying.

In order to achieve the objectives, according to the present disclosure, there is provided a heating and air purifying apparatus using electronic device heat, the apparatus including: a cabinet accommodating electronic devices including a central processing unit (CPU), a graphic processing unit (GPU), a power supply unit (PSU), and a main board, having an air inlet on a side, and having an air outlet on a top; one or more partition plates disposed vertically, horizontally, or diagonally across the inner space of the cabinet; and a discharge fan installed at the air outlet and discharging air in the cabinet to the outside, in which a cooling fan of the GPU is disposed on a first side of the one or more partition plates, a GPU body including a graphic card of the GPU is disposed on a second side opposite to the first side, and the CPU, the PSU, and the main board are accommodated in a space facing the first side of the one or more partition plates; and high-temperature heat generated by the electronic devices is discharged to the air outlet, whereby air is purified and hot air is produced.

Air flowing in the cabinet through the air inlet may be discharged to the air outlet along the second side of the one or more partition plates.

The one or more partition plates may include a plurality of slots in which the GPUs are disposed.

The one or more partition plates may be made of at least one of cypress and Japanese cedar.

The one or more partition plates may be diagonally elongated and disposed from a surface spaced a first distance apart from an upper end of the cabinet to a surface spaced a second distance apart from a lower end of the cabinet.

The upper end and the lower end of the cabinet may be points vertically extending the cabinet, the air outlet may be disposed over an opposite side of the one or more partition plates diagonally extending, and the first distance may be longer than the second distance.

The apparatus may include a sound absorber attached inside or outside the cabinet.

An air distributor having one or more blades distributing air discharged from the cabinet may be disposed at a side adjacent to the air outlet on the top of the cabinet.

An air purification filter may be disposed at the air outlet.

An air intake port for cooling the CPU, the PSU, and the main board may be disposed on an opposite side of the one or more partition plates.

According to the present disclosure, the inside of a cabinet is divided by one or more partition plates, a GCU, and other CPU and PSU are disposed in different directions, particularly, diagonally, whereby there is an advantage that it is possible to effectively discharge heat generated in the cabinet to the outside.

DETAILED DESCRIPTION

The present disclosure may be modified in various ways and implemented by various exemplary embodiments, so that specific exemplary embodiments are shown in the drawings and will be described in detail.

However, it is to be understood that the present disclosure is not limited to the specific exemplary embodiments, but includes all modifications, equivalents, and substitutions included in the spirit and the scope of the present disclosure.

Figure 1:
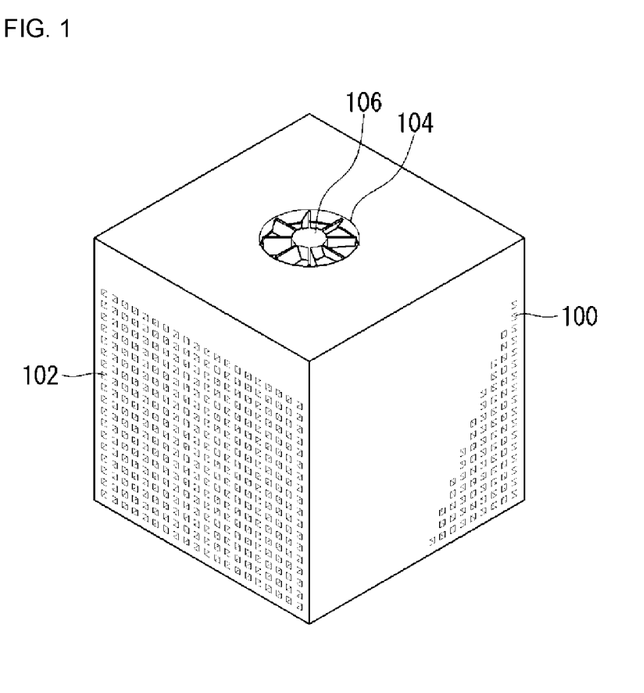
FIG. 1 is a perspective view of a heating and air purifying apparatus using electronic device heat according to an exemplary embodiment of the present disclosure.
Figure 2:
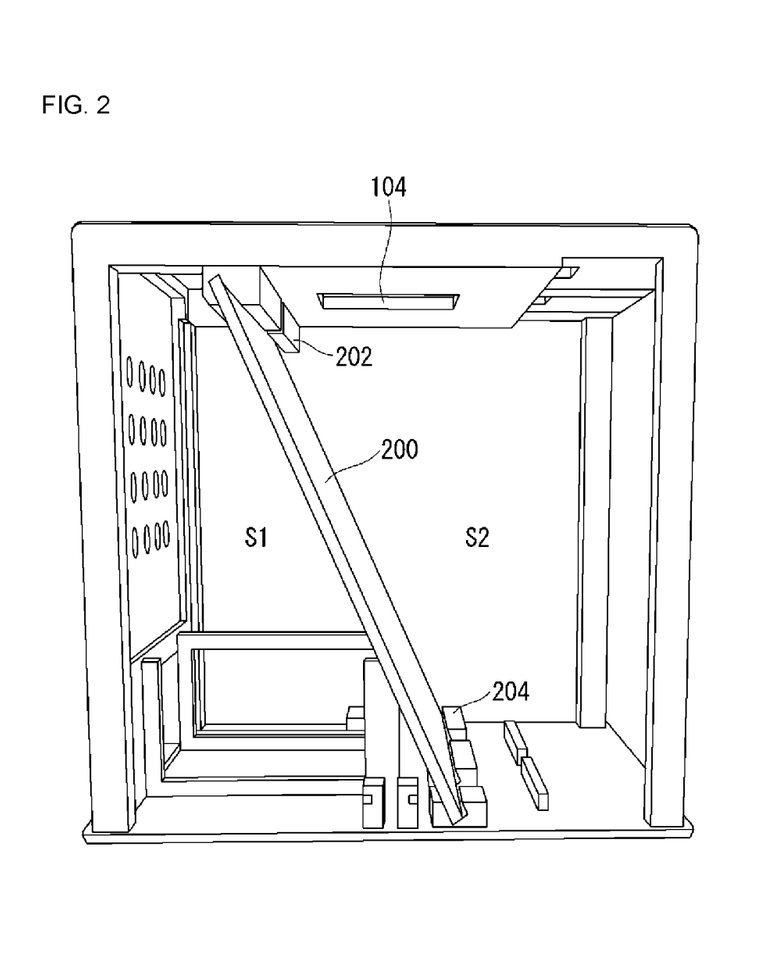
FIG. 2 is a view showing the state in which a partition plate is disposed in a cabinet according to an embodiment of the present disclosure.
Figure 3:
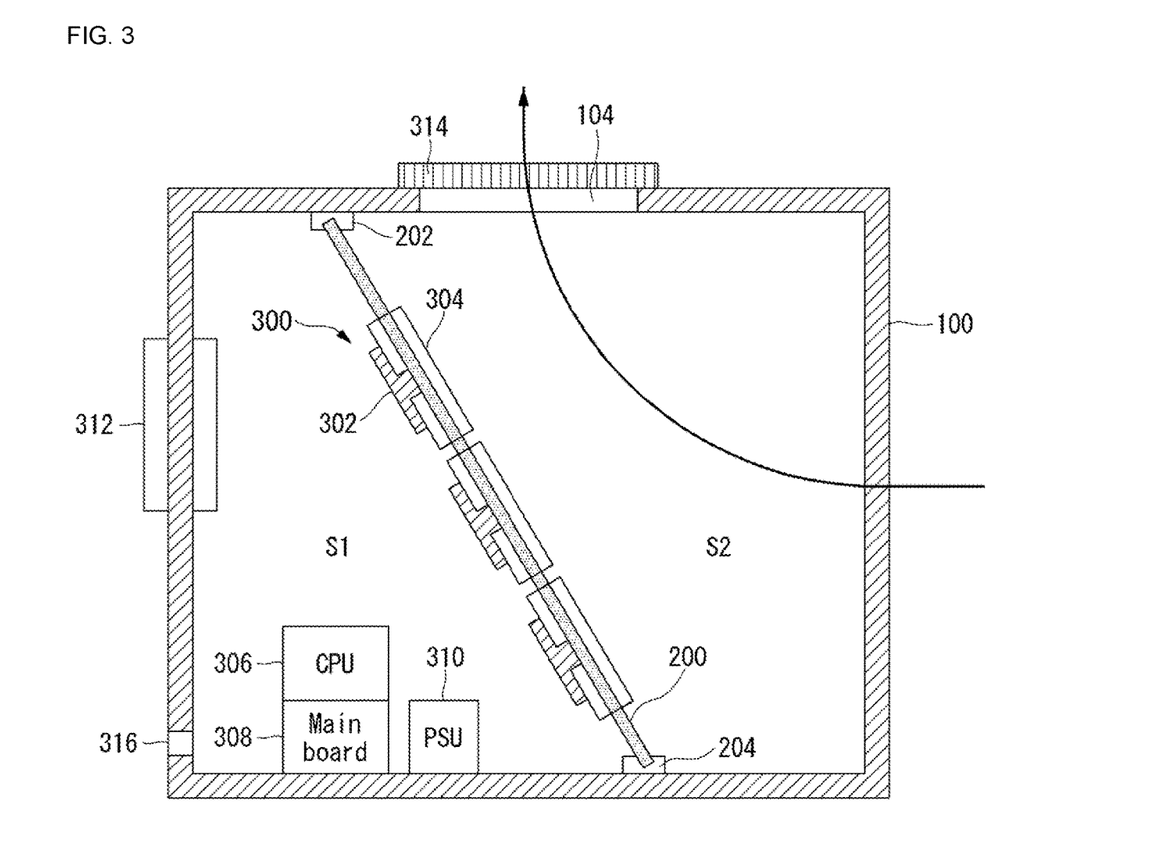
FIGS. 3, 3A, and 3B are views showing a cross-section of the inside of the cabinet according to embodiments of the present disclosure.
Figure 3A:
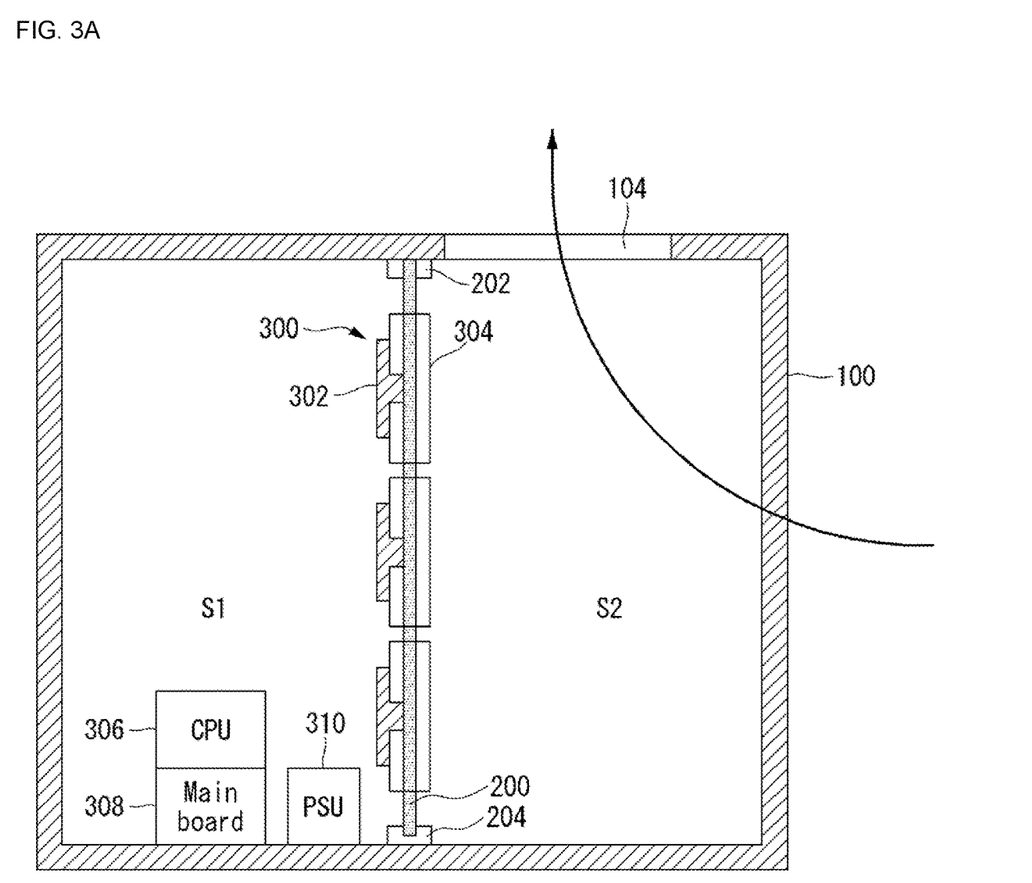
Figure 3B:
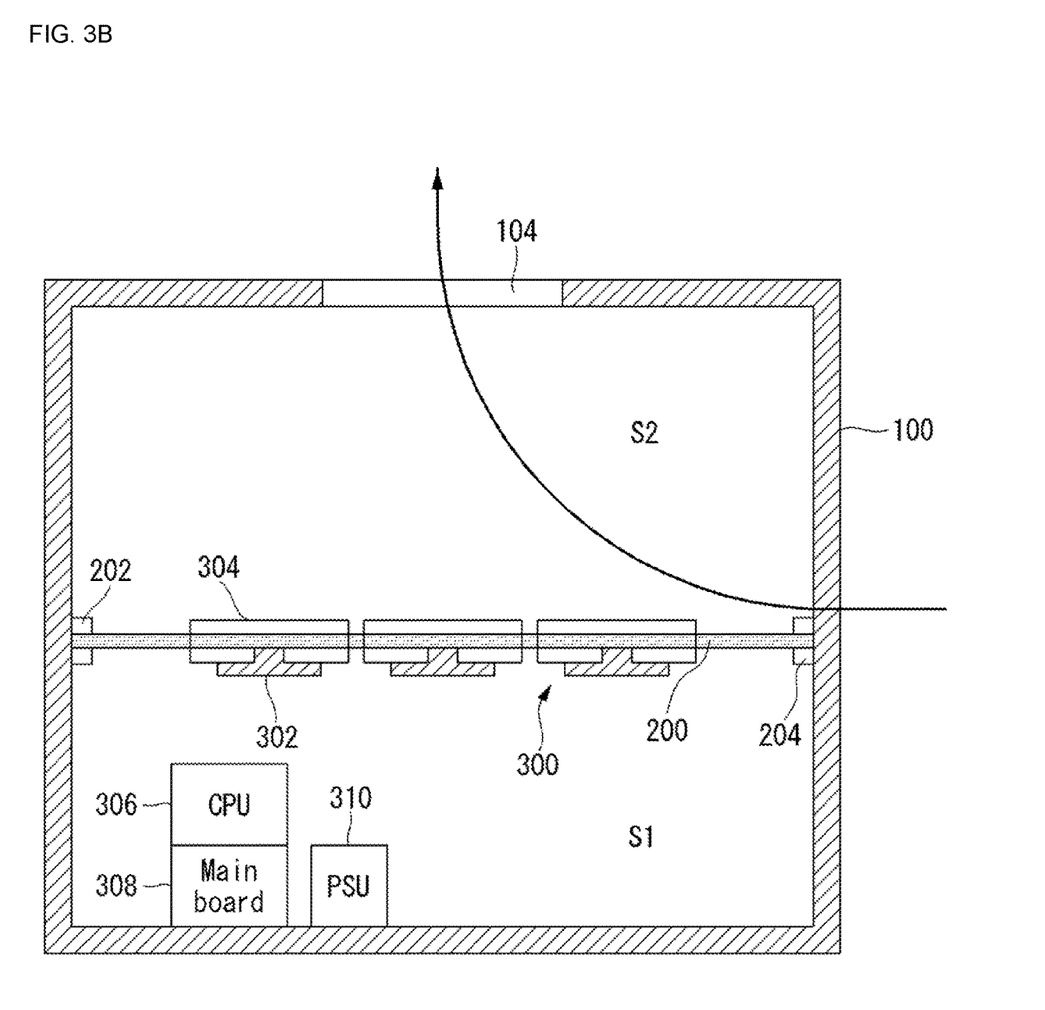

FIG. 1 is a perspective view of a heating and air purifying apparatus using electronic device heat according to an exemplary embodiment of the present disclosure, FIG. 2 is a view showing the state in which a partition plate is disposed in a cabinet according to an embodiment of the present disclosure, and FIGS. 3, 3A and 3B are views showing a cross-section of the inside of the cabinet according to embodiments of the present disclosure.

Referring to FIG. 1, a cabinet 100 according to the present disclosure has an air inlet 102 formed on a side and an air outlet 104 formed on the top.

The air inlet 102 formed on the side of the cabinet 100 may include a plurality of holes having a predetermined size to be able to protect an electronic device accommodated in the cabinet 100 and allow air to flow inside.

The air outlet 104 is disposed on the top of the cabinet 104, and preferably, a discharge fan 106 that forcibly discharges air in the cabinet to the outside may be disposed in the air outlet 104.

Although one discharge fan 106 is shown in FIG. 1, a plurality of discharge fans 106 may be provided at the air outlet 104.

The discharge fan 106 forcibly discharges high-temperature heat generated by the electronic device accommodated in the cabinet 100. Further, an air purification filter 314 shown in FIG. 3 is disposed adjacent to the discharge fan 106, so air is purified and hot air is generated.

According to an exemplary embodiment of the present disclosure, one or more partition plates disposed vertically, horizontally, or diagonally across the inner surface of the cabinet 100 is provided as shown in FIGS. 3, 3A, and 3B.

In FIG. 2, one partition plate 200 disposed diagonally across the inner surface of the cabinet 100 is exemplarily shown.

As shown in FIG. 2, the partition plate 200 may be diagonally elongated and disposed from a surface spaced a first distance apart from an upper end of the cabinet 100 to a surface spaced a second distance apart from a lower end of the cabinet 100.

A first fitting portion 202 in which an end of the partition cabinet 200 is fitted is formed on the top inside the cabinet 100, and a second fitting portion 204 in which another end of the partition plate 200 is fitted is formed on the bottom inside the cabinet 100.

According to this disposition, the partition plate 200 divides the inside of the cabinet 100 into a first space S1 and a second space S2.

As shown in FIG. 3, a cooling fan 302 of a GPU 300 is disposed in the first space S1 formed at a side of the partition plate 200, and a GPU body 304 including a graphic card of the GPU 300 is disposed in the second space S2 formed at another side of the partition plate 200.

In consideration of the fact that the GPU 300 generates very high-temperature heat in comparison to other electronic devices, in the present embodiment, the inside of the cabinet 100 is divided into different spaces S1 and S2 by the partition plate 200, and a CPU 306, a main board 308, and a power supply unit (PSU) 310 are disposed in the first space S1 separated from the second space S2 in which high-temperature heat is generated by operation of the graphic card.

In particular, it is important to efficiently discharge the high-temperature heat that is generated in the second space S2, and according to the present embodiment, the air outlet 104 of the cabinet 100 is disposed on the top of the second space S2 in which high-temperature heat is generated.

FIGS. 2, 3, 3A, and 3B exemplarily show that the air outlet 104 is formed at the center of the top of the cabinet 100, but the present disclosure is not limited thereto and a plurality of air outlets 104 may be formed on the top of the cabinet 100.

Figure 4:
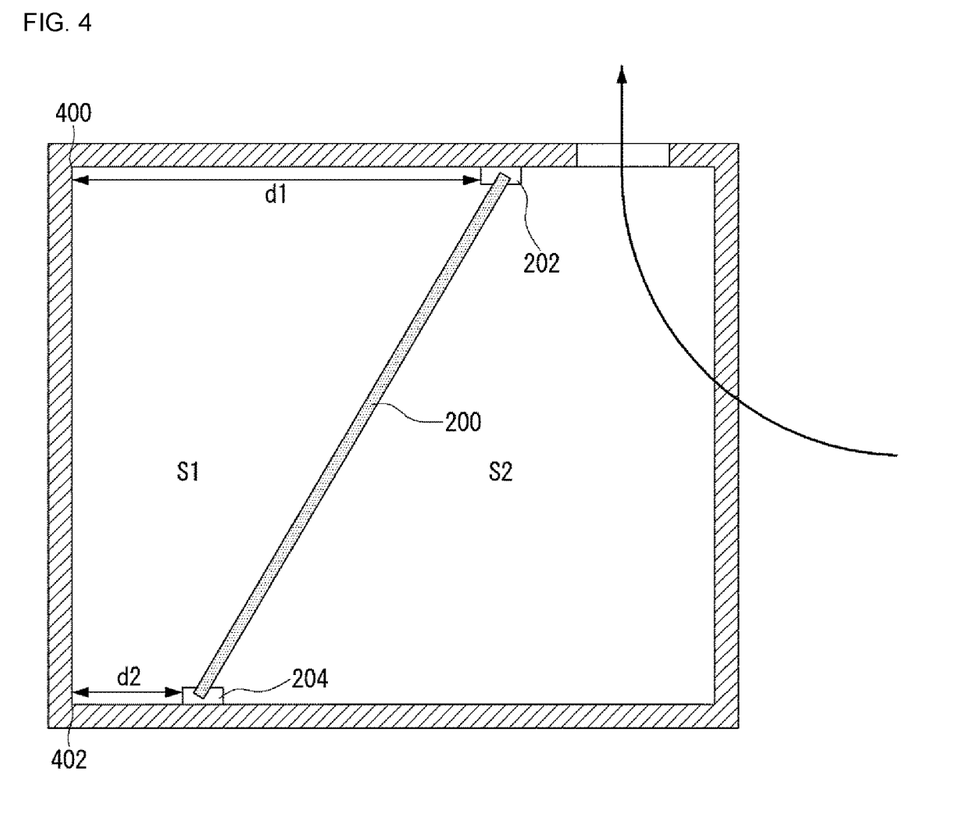
FIG. 4 is a view showing a cross-section of the inside of a cabinet according to another embodiment of the present disclosure.

FIG. 4 is a view showing a cross-section of the inside of a cabinet according to another embodiment of the present disclosure.

Referring to FIG. 4, it is possible to decrease the cross-sectional area of the inside of the cabinet 100 in the second space S2 toward the top through which air is discharged, using Bernoulli principle.

To this end, when the partition plate 200 is disposed at the first distance and the second distance from vertically extending upper end 400 and lower end 402 of the cabinet 100 to separate the first space S1 and the second space S2, the first distance d1 at the upper portion may be longer than the second distance d2 at the lower portion.

Accordingly, the air flowing in the second space S2 can be quickly discharged through the air outlet 104.

In order to increase the air purification effect, one or more partition plates 200 according to the present disclosure may be made of materials that produce phytoncide such as cypress and Japanese cedar. Further, since such materials emit fragrance too, satisfaction of users can also be increased.

Figure 5:
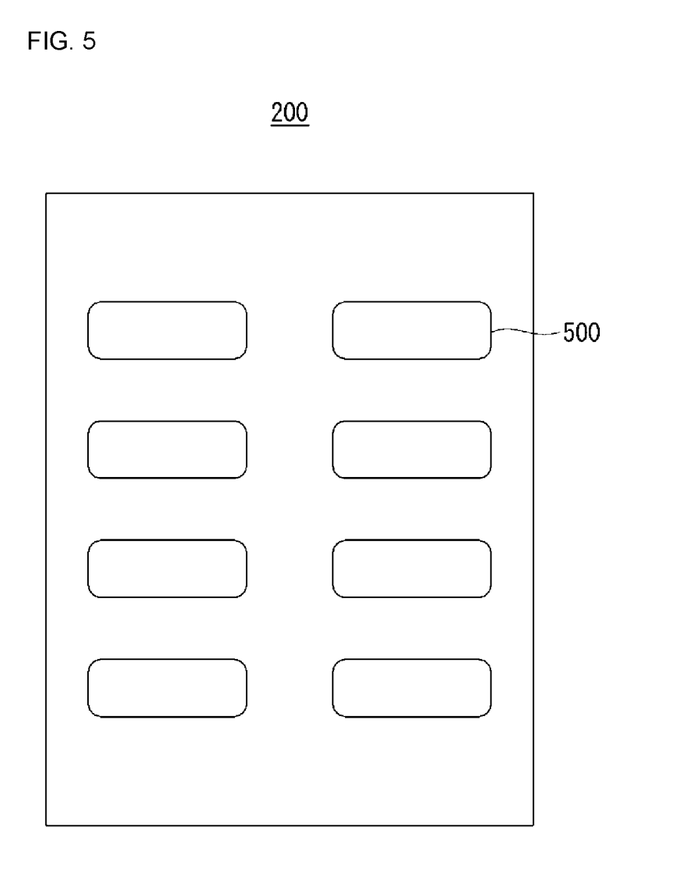
FIG. 5 is a view showing the detailed structure of the partition plate according to the present embodiment.

FIG. 5 is a view showing the detailed structure of the partition plate according to the present embodiment.

As shown in FIG. 5, the partition plate 200 according to the present embodiment may include a plurality of slots 500 in which GPUs 300 are inserted.

As described above, cooling fans 302 of GPUs 300 are disposed on sides of the plurality of slots 500, and GPU bodies 304 including graphic cards of the GPUs 202 are disposed in the second space S2 formed at the opposite side of the partition plate 200.

Although the partition plate 200 is diagonally disposed across the inside of the cabinet 100 in the figures, the present disclosure is not limited thereto and it may be vertically or horizontally disposed as shown in FIGS. 3A and 3B.

Even though the partition plate 200 is vertically or horizontally disposed, the inside of the cabinet 100 can be divided into a first space and a second space. Further, the high-temperature heat generation part of a GPU is disposed in the second space, and other electric devices are disposed in the first space, thereby being able to prevent a CPU, etc. from being influenced by high-temperature heat generated by the GPU.

In this case, the first space may be formed at the lower portion in the cabinet and the second space is formed at the upper portion in the cabinet.

Referring to FIG. 3 again, a separate air intake port 316 may be provided in the first space S1 to cool the CPU 306, the main board 308, and the PSU 310 disposed in the first space S1.

The air intake port 316 is disposed in the cabinet 100, thereby forcibly suctioning air from a side of the cabinet 100 and then discharges air rising therein to the opposite side of the cabinet 100.

In order to block noise that is generated in the cabinet 100, a sound absorber 312 (shown in FIG. 3) having a shape that does not close the air inlet 102 may be attached inside or outside the cabinet 100.

Figure 6:
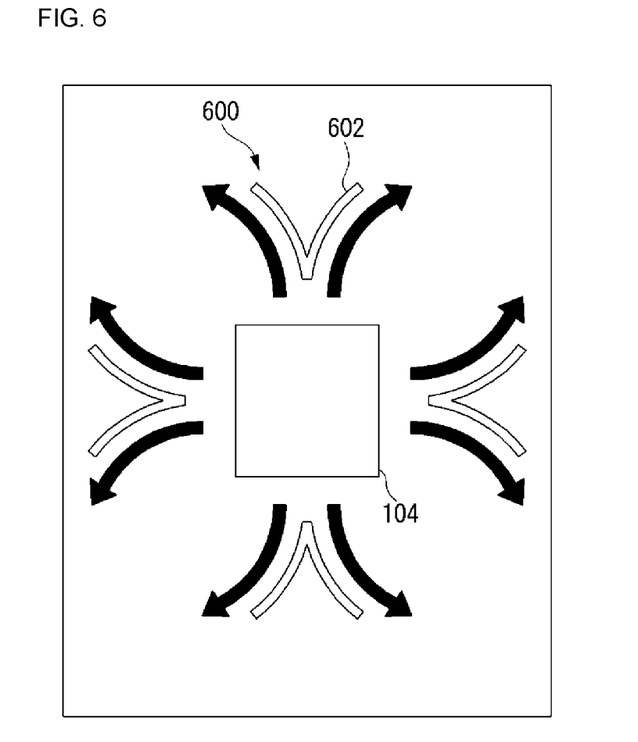
FIG. 6 is a view showing the top structure of the cabinet according to the present embodiment.

FIG. 6 is a view showing the top structure of the cabinet according to the present embodiment.

As shown in FIG. 6, an air distributor 600 having one or more blades 602 that distributes air discharged from the cabinet 100 may be disposed adjacent to the air outlet 104 on the top of the cabinet 100 according to the present embodiment.

The air distributor 600 according to the present embodiment, which is provided to uniformly distribute heat and purified air throughout the space in which the cabinet 100 is disposed, may be formed in four directions or may be circumferentially formed around the air outlet 104.

The air discharged out of the cabinet 100 may be used to grow crops and the high-temperature heat inside the cabinet 100 may be used to remove corona viruses that are extirpated at 60~70 degrees.

The above embodiments of the present disclosure are provided for examples, various changes, modifications, and additions may be possible within the spirit and scope of the present disclosure by those skilled in the art, and those changes, modifications, and additions should be construed as being included in the following claims.

What is claimed is:

1. A heating and air purifying apparatus using electronic device heat, the apparatus comprising:
    a cabinet accommodating electronic devices including a central processing unit (CPU), a graphic processing unit (GPU), a power supply unit (PSU), and a main board, having an air inlet on a side, and having an air outlet on a top;
    one or more partition plates disposed vertically, horizontally, or diagonally across an inner space of the cabinet; and
    a discharge fan installed at the air outlet and discharging air in the cabinet to outside of the cabinet,
    wherein a cooling fan of the GPU is disposed on a first side of the one or more partition plate, a GPU body including a graphic card of the GPU is disposed on a second side opposite to the first side, and the CPU, the PSU, and the main board are accommodated in a space facing the first side of the one or more partition plate; and
    high-temperature heat generated by the electronic devices is discharged to the air outlet, whereby air is purified and hot air is produced.

2. The apparatus of claim 1, wherein air flowing in the cabinet through the air inlet is discharged to the air outlet along the second side of the one or more partition plates.

3. The apparatus of claim 1, wherein the one or more partition plates include a plurality of slots in which the GPU is disposed.

4. The apparatus of claim 1, wherein the one or more partition plates are made of at least one of cypress and Japanese cedar.

5. The apparatus of claim 1, wherein the one or more partition plates are diagonally elongated and disposed from a first fitting portion formed on the top inside of the cabinet to a second fitting portion formed on the bottom inside of the cabinet.

6. The apparatus of claim 5, wherein the air outlet is disposed over the second side of the one or more partition plates.

7. The apparatus of claim 1, further comprising a sound absorber attached inside or outside of the cabinet.

8. The apparatus of claim 1, wherein an air distributor having one or more blades distributing air discharged from the cabinet is disposed at a side adjacent to the air outlet on the top of the cabinet.

9. The apparatus of claim 1, wherein an air purification filter is disposed at the air outlet.

10. The apparatus of claim 1, wherein an air intake port for cooling the CPU, the PSU, and the main board is disposed in the space facing the first side of the one or more partition plates.

* * * * *